United States Patent [19]

Gerstenköper et al.

[11] 4,188,637
[45] Feb. 12, 1980

[54] DISC-SHAPED SEMICONDUCTOR DEVICE HAVING AN ANNULAR HOUSING OF ELASTOMER MATERIAL

[75] Inventors: Heinrich Gerstenköper; Heinz Juchmann, both of Warstein, Fed. Rep. of Germany

[73] Assignee: Licentia Patent-Verwaltungs-G.m.b.H., Frankfurt am Main, Fed. Rep. of Germany

[21] Appl. No.: 813,409

[22] Filed: Jul. 6, 1977

[30] Foreign Application Priority Data

Jul. 6, 1976 [DE] Fed. Rep. of Germany ....... 2630320

[51] Int. Cl.² ................... H01L 23/42; H01L 23/44; H01L 23/46
[52] U.S. Cl. ........................................ 357/79; 357/72; 357/81
[58] Field of Search ............... 357/72, 74, 79, 76, 357/81

[56]   References Cited
U.S. PATENT DOCUMENTS

| 2,726,357 | 12/1955 | Sachs | 357/72 |
| 3,443,168 | 5/1969 | Camp et al. | 357/72 |
| 3,536,964 | 10/1970 | Lob et al. | 357/72 |
| 3,844,029 | 10/1974 | Dibugnara | 357/72 |
| 3,890,637 | 6/1975 | Yamamoto | 357/72 |
| 3,940,787 | 2/1976 | Juchmann | 357/75 |
| 3,986,201 | 10/1976 | Herold et al. | 357/74 |
| 3,992,717 | 11/1976 | Rice | 357/79 |

FOREIGN PATENT DOCUMENTS

| 2250753 | 5/1973 | Fed. Rep. of Germany | 357/72 |
| 2260217 | 6/1973 | Fed. Rep. of Germany | 357/72 |
| 2332896 | 1/1975 | Fed. Rep. of Germany | 357/75 |
| 2162275 | 7/1973 | France | 357/72 |
| 1104515 | 2/1968 | United Kingdom | 357/72 |
| 1353602 | 5/1974 | United Kingdom | 357/79 |

Primary Examiner—Andrew J. James
Attorney, Agent, or Firm—Spencer & Kaye

[57] ABSTRACT

An assembly composed of a disc-shaped semiconductor component mounted on a support disc and disposed in an annular housing, with the support disc being clamped between two contacting discs of larger diameter than the support disc and serving as electrode contacts, the housing being of an elastomer material and having a passage whose diameter, when the housing is unstressed, is smaller than the diameters of the contacting discs, and the unit formed by the contacting discs with the support disc clamped therebetween being pressed into the passage in the housing so that the housing keeps the contacting discs pressed against the support disc and hermetically seals the space between the contacting discs.

6 Claims, 1 Drawing Figure

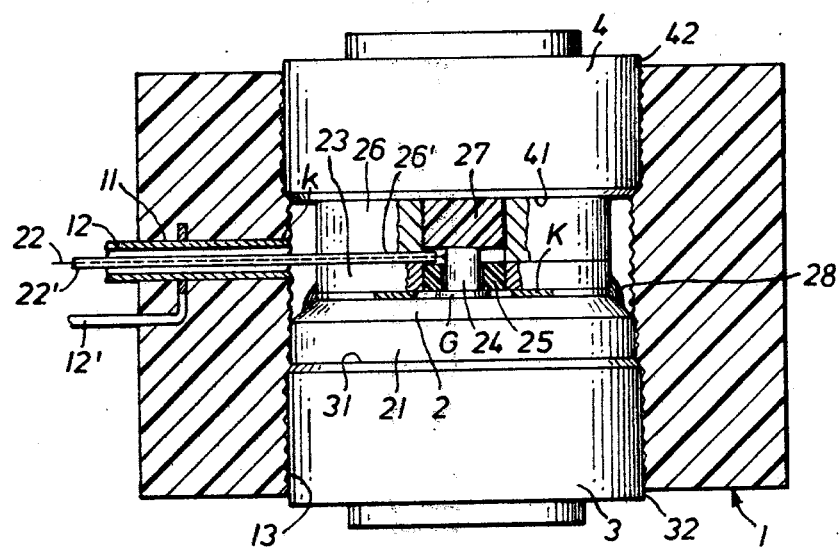

DISC-SHAPED SEMICONDUCTOR DEVICE HAVING AN ANNULAR HOUSING OF ELASTOMER MATERIAL

BACKGROUND OF THE INVENTION

The present invention relates to a semiconductor assembly of the type composed of a disc-shaped semiconductor device disposed in an annular housing, the device including a semiconductor wafer designed to be used as a rectifier diode or as a thyristor and clamped, via its two major surfaces, between two contacting discs serving as electrode contacts, the internal diameter of the housing being equal to or less than that of the contacting discs.

German Offenlegungsschrift (Laid-Open Application) No. 23 32 896 and corresponding U.S. Pat. No. 3,940,787, disclose a disc-shaped semiconductor assembly having the above-mentioned features which, in principle, is constructed as a component which can be manufactured at low cost. By using an electrically insulated centering sleeve, or ring, to mount the arrangement formed by the two contacting discs with the semiconductor wafer therebetween and by using supporting rings which radially extend from the outer faces of the contacting discs and support the centered arrangement elastically against the housing, the semiconductor wafer in this semiconductor cell can be set into, and be removed from the pressure contacting device. In order to enclose the semiconductor wafer hermetically, however, the composite semiconductor cell is encased in a hardenable potting mass.

SUMMARY OF THE INVENTION

It is an object of the present invention to provide an improved arrangement of this type which can also be manufactured at low cost and which can be cooled on both major faces of the semiconductor device which includes a semiconductor wafer designed as a rectifier diode or thyristor hermetically enclosed therein, without requiring the use of a potting mass.

These and other objects are achieved according to the present invention, in an assembly having the general form described above, by making the annular housing of an elastomer material, giving the axial passage defined in the annular housing a diameter which, in the unstressed state of the housing, is smaller than the diameters of the contacting discs, and establishing a press fit between the unit formed by the contacting discs with the support disc clamped therebetween and the housing surface defining the axial passage in order to maintain the pressure contact of the contacting discs with the support disc and create a hermetic seal in the space defined between the contacting discs.

When the wafer contains a thyristor provided on one surface with a central control, or gate, electrode, contact to that electrode may be effected in the usual manner, for example by soldering or welding. However, according to a particularly favorable embodiment of the invention, this gate electrode is pressed, via the contacting discs, with the aid of a molded elastomer body, against a connecting device for a gate terminal lead to form a pressure contact.

In a semiconductor device including a semiconductor wafer which is placed on a supporting disc having a smaller diameter than the contacting discs, a further embodiment of the invention provides that a centering ring is disposed between the edge face of the supporting disc and the inner edge face of the annular housing.

According to another feature of the invention, secure pressure contacting between the gate electrode and a gate terminal lead is accomplished for a semiconductor device having a semiconductor wafer designed as thyristor by covering the cathode of the thyristor with an annular silver disc and the gate electrode with a silver cylinder as the connecting device from which a control terminal lead extends radially within a Teflon sheath, a centering ring of insulating material being employed for the silver cylinder, and the annular silver disc is covered with an identically shaped annular disc of copper which is provided in a known manner with a radial slit to accommodate the Teflon sleeve and the gate terminal lead and with a central bore of larger diameter than the silver cylinder, in which bore a cylinder-shaped elastomer plug is pressed to form pressure contact between the silver cylinder and the gate electrode.

According to further embodiments of the invention, in these semiconductor cells either the inner peripheral surface of the annular housing is provided with a toothed profile or the outer peripheral surfaces of the contacting discs are provided with a toothed profile.

BRIEF DESCRIPTION OF THE DRAWINGS

The single FIGURE of the drawing is a cross-sectional view along a diameter of a preferred embodiment of a semiconductor assembly according to the invention including a semiconductor wafer in the form of a thyristor, the axial dimension of the semiconductor wafer being shown to an enlarged scale.

DESCRIPTION OF THE PREFERRED EMBODIMENTS

The semiconductor assembly shown in the FIGURE includes an annular housing 1 of an elastomer, for example a material sold under the trademark Vulkollan by Farbenfabriken Bayer AG, Federal Republic of Germany, or under the trademark Viton by E. I. du Pont de Nemours, of Wilmington, Del.

Vulkollan is a rubberlike elastical material of polyurethane with non-abrasive quality.

Viton is a fluor containing hydrocarbonic with distinguished properties.

Some physical parameters of the same are compiled at the end of this specification. Housing 1 is provided with a radially oriented channel 11 with a metal tube 12 inserted therein. The semiconductor assembly further includes a circular thyristor disc 2 which has approximately the same diameter as the inner diameter of housing 1, and two contacting discs 3 and 4, both having the same diameter which is slightly larger than the inner diameter of the housing.

This semiconductor assembly is constructed and assembled in such a manner that in the illustrated assembled condition the contacting disc 3 is first pressed into the axial passage in annular housing 1 whose inner peripheral surface 13 may advisably be formed to have a toothed profile. Thereafter, thyristor disc 2 is introduced into the still open end of the passage in housing 1 and its supporting disc 21, which is connected with the thyristor anode electrode, is placed onto the planar major surface 31 of contacting disc 3. Desired centering of the thyristor disc in the housing 1 can be effected with the aid of a centering ring of insulating material, which ring is to be disposed between the peripheral surface of supporting disc 21 and the inner peripheral surface 13 of housing 1 and must be placed onto the planar major surface 31 of the disc 3 before the thyristor disc is inserted.

Then the control, or gate, terminal lead 22 of the thyristor 2, which is disposed in a Teflon sleeve 22', is brought radially through metal tube 12 in channel 11 and out of the annular housing 1, and finally the contacting disc 4 is pressed into the passage in housing 1 at the open end thereof so that its planar major surface 41 comes into contact with the cathode K of the thyristor.

Thus, the thyristor disc 2 is clamped in between discs 3 and 4 and already is in conductive pressure contact therewith. Moreover, the semiconductor wafer, i.e., thyristor disc 2, is hermetically sealed in the semiconductor assembly.

This is accomplished in particular by the elastic form fitting capability of the elastomer of housing 1 and the hermetic encapsulation of the semiconductor wafer is yet improved by the toothed, or serrated, inner peripheral surface of housing 1. Instead of giving this inner peripheral surface a toothed form, the outer peripheral surfaces 32 and 42 of the contacting discs 3 and 4 may be provided with a toothed profile. With respect to the hermetic encapsulation of the semiconductor wafer in the assembly, this latter arrangement produces the same effect.

Directly after the encapsulation in the semiconductor assembly the thyristor component may be clamped, via its axial end faces, between respective faces of two pressuring cooling bodies and may then be subjected to electrical measuring tests and can be put into operation if it passes these tests.

By the application of pressure via the contacting discs, with the aid of a molded body made of an elastomer, it is possible to particularly establish conductive pressure contact between the gate electrode G of the semiconductor wafer 2 designed as a thyristor and control terminal lead 22. For this purpose, the annular cathode electrode K of the thyristor is covered with an annular silver ring 23 and the central control electrode G is covered with a silver cylinder 24 serving as the control electrode contact, from which the control terminal lead 22 radially extends through Teflon sleeve 22'. A centering ring 25 of an electrical insulating material is provided for centering cylinder 24 in ring 23.

The annular silver ring 23 is covered with a similar annular ring 26 of copper which, as is known, is provided with a radial slit 26' to accommodate the Teflon sleeve 22' and the control terminal lead 22 and which has the same inner diameter and outer diameter as the ring 23.

A cylindrical plug 27 of an elastomer material, for example the material sold under the trademark Viton, which plug has, in its unstressd state, a diameter only slightly larger than the inner diameter of copper ring 26, is inserted and pressed into the copper ring 26. This plug is pressed in to a sufficient extent to assure that, between the contacting discs, control electrode G is securely pressure contacted by silver cylinder 24.

The centering ring 25 may be made, for example, of Teflon or of a hard woven material of silicone glass or an epoxy resin. Its outer diameter is adapted to the inner diameter of silver ring 23 and its inner diameter is adapted to the diameter of silver cylinder 24.

Thyristor disc 2 and its support disc 21 are inserted, as explained above, into the annular housing 1 in the order of assembly as described above to effect pressure contacting between the control electrode G and the control terminal lead 22 and so that disc 21 is placed onto the planar major surface 31 of the contacting disc 3. As can be seen in the drawing the elements which are subsequently assembled are firmly connected with the thyristor disc 2 by means of a ring, or bead, 28 of a lacquer, for example, a silicone lacquer, which fixes ring 23, and thus also ring 25 and disc 24, in position relative to disc 2.

A contacting tongue 12', which is brought out of annular housing 1 next to channel 11, may be in contact with the metal tube 12 disposed in channel 11. This contacting tongue may be used as an additional control terminal device. The control terminal device and such a contacting tongue connected therewith may also be injection molded or pressed into the annular housing. In the former case, a holding device is used to hold the metal tube 12 and the contacting tongue 12' in the injection mold for the housing so that they are encapsulated during the injection-molding process. In the latter case, these parts are pressed into a finished housing, through a radial bore which has been formed in the housing to have a slightly smaller diameter than metal tube 12. For this purpose the metal tube is held in place by a cone-shaped part k fastened to, or integral with, the metal tube.

The semiconductor assembly composed according to the invention can of course not meet high demands as for setting the semiconductor wafer designed as a thyristor or rectifier diode into, and removing from, the housing as often as desired. The advantages attained by the present invention rather enhance the structure and the manufacture of semiconductor assemblies which can be produced at low cost. These advantages result from the use of a cheaper material, such as, for example, Vulkollan, for the annular housing 1, as well as from the extremely simple sealing of the semiconductor assembly by a type of plug connection and the easy assembly of the component parts.

Some physical parameters of the materials Vulkollan and Viton, as specified earlier herein, of which the housing 1 and the plug 27 are made are compiled as follows

|  | Vulkollan | Viton |
| --- | --- | --- |
| Density | 1.25 g/cm$^3$ | 1.9 g/cm$^3$ |
| Tensile strength | 300–400 Kp/cm$^2$ | 120–190 Kp/cm$^2$ |
| Elasticity to rebound | 47–50% (percentage figure) | 10% |
| Extensibility | 600–700% (percentage figure) | 150–300% |
| Hardness | 65–98° Shore A | 70–90° Shore A |
| Abrasion | 50 mm$^3$ |  |
| Tenacity | 50 kg/cm |  |
| Electrical resistance | 10$^{11}$ Ohm × cm | 2.5 · 10$^{13}$ Ohm × cm |
| Breakdown voltage | 25 KV/mm per meter | 14 KV/mm per meter |
| Thermal stability |  |  |

| | Vulkollan | Viton |
|---|---|---|
| within | −15° C. up to 110° C. | −40° C. up to 200° C. |
| Compression set ASTM D 395,Met,B | | |
| 70 hours at 121° C. | | 24% (percentage figure) |
| 70 hours at 204° C. | | 30% (percentage figure) |

It will be understood that the above description of the present invention is susceptible to various modifications, changes and adaptations, and the same are intended to be comprehended within the meaning the range of equivalents of appended claims.

What is claimed is:

1. In a disc-shaped semiconductor arrangement composed of an annular housing of elastomer material having a hollow cylindrical interior, two contacting discs of cylindrical shape, and a disc-shaped semiconductor body defining a thyristor, having two opposed major surfaces, one major surface having a gate electrode centered therein and an annular cathode electrode surrounding the gate electrode, and the other major surface providing an anode electrode, and the semiconductor body having a cylindrical shape with a diameter no greater than that of either contacting disc, the semiconductor body being clamped, via its major surfaces, between respective axial end faces of the contacting discs, and being hermetically sealed in the housing, the improvement wherein: the hollow interior of said housing has the form of a circular cylinder; the diameter of the interior of said housing, when said housing is unstressed, is smaller than the diameter of each of said contacting discs; said contacting discs, with said semiconductor body clamped therebetween, are press fitted into the interior of said housing; the elastomer material of said housing has physical properties such that said housing acts on said contacting discs in a manner to maintain pressure contact between said contacting discs and the major surfaces of said semiconductor body and to establish a hermetic seal in the space defined between said contacting discs; and said arrangement further comprises means defining a gate electrode connector in the form of a silver disc contacting said gate electrode; a molded body of elastomer material disposed in said housing interior for establishing a pressure contact between said connector and said gate electrode, via the contacting discs, an annular silver ring aligned with, and contacting said cathode electrode, a conductive lead connected to said silver disc and extending radially through said housing, a Teflon sleeve enclosing said lead, a centering ring of insulating material disposed between said silver disc and said silver ring, and a copper ring aligned with, and contacting, said silver ring and having an outer diameter substantially corresponding to that of said silver ring and an inner diameter greater than that of said silver ring, said copper ring being further provided with a radially extending slit for passage of said sleeve and said lead, and wherein said molded body of elastomer material is press fitted into the interior of said copper ring for pressing said silver disc against said gate electrode, and said silver ring, said silver disc, said sleeve, said copper ring and said molded body are all interposed between said one major surface of said semiconductor body and an associated one of said contacting discs.

2. An arrangement as defined in claim 1 wherein said housing is provided with a radially extending channel and further comprising a tube extending through said channel and containing said Teflon sleeve and said lead.

3. An arrangement as defined in claim 2 further comprising a contact tongue electrically connected to said tube and extending out of said housing.

4. An arrangement as defined in claim 1 wherein the inner peripheral surface of said housing is provided with a toothed profile defined by teeth spaced apart axially along said surface.

5. An arrangement as defined in claim 1 wherein the outer peripheral surfaces of both of said contacting discs are provided with a toothed profile defined by teeth spaced apart axially along said surfaces.

6. An arrangement as defined in claim 1 wherein connection of a terminal lead of said thyristor to said gate electrode is effected by soldering or welding.

* * * * *